US010416551B2

(12) United States Patent
Aihara et al.

(10) Patent No.: US 10,416,551 B2
(45) Date of Patent: Sep. 17, 2019

(54) IMPRINTING APPARATUS, IMPRINTING METHOD, AND ARTICLE MANUFACTURING METHOD

(71) Applicant: CANON KABUSHIKI KAISHA, Tokyo (JP)

(72) Inventors: Sentaro Aihara, Utsunomiya (JP); Ken Minoda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 560 days.

(21) Appl. No.: 14/962,978

(22) Filed: Dec. 8, 2015

(65) Prior Publication Data
US 2016/0167261 A1 Jun. 16, 2016

(30) Foreign Application Priority Data

Dec. 12, 2014 (WO) .................. PCT/JP2014/082972

(51) Int. Cl.
B29C 67/00 (2017.01)
G03F 7/00 (2006.01)

(52) U.S. Cl.
CPC .................. *G03F 7/0002* (2013.01)

(58) Field of Classification Search
CPC .................. B29C 43/58; B29C 43/5833
USPC .......................................................... 425/385
See application file for complete search history.

(56) References Cited

U.S. PATENT DOCUMENTS

| 7,567,344 | B2 * | 7/2009 | LeBlanc | G01N 21/896 356/237.2 |
| 8,845,317 | B2 * | 9/2014 | Suehira | G03F 7/0002 425/150 |
| 2011/0266706 | A1 * | 11/2011 | Dijksman | G03F 7/0002 425/150 |
| 2015/0084238 | A1 * | 3/2015 | Bonassar | A61L 27/36 264/308 |

FOREIGN PATENT DOCUMENTS

| JP | 2006514428 A | 4/2006 |
| JP | 2007139752 A | 6/2007 |
| JP | 2012018096 A | 1/2012 |
| JP | 2013030757 A | 2/2013 |
| JP | 2013102139 A | 5/2013 |
| JP | 2013-178231 A | 9/2013 |

* cited by examiner

Primary Examiner — Joseph S Del Sole
Assistant Examiner — Thu Khanh T Nguyen
(74) Attorney, Agent, or Firm — Canon U.S.A., Inc. IP Division

(57) ABSTRACT

An image pickup apparatus includes a receiver that receives, from an external apparatus, an instruction for changing a zoom position of a lens, a controller that performs control processing to change a zoom position of the lens based on a received instruction, and a determination unit that determines whether the external apparatus includes a function regarding zooming of the lens. While determining the external apparatus including the function, the controller controls a zoom adapter, which performs a zoom setting of the lens and is attached to the lens, to change a zoom position of the lens based on a zoom setting notified by the external apparatus. While determining the external apparatus not including the function, the controller controls the zoom adapter to change a zoom position of the lens based on a zoom setting performed in the zoom adapter.

12 Claims, 17 Drawing Sheets

FIG. 12

| DETECTION MODE | WAVELENGTH SWITCHING MECHANISM | POLARIZATION SWITCHING MECHANISM | ILLUMINATION-MODE SWITCHING MECHANISM | SETTING OF IMAGE PICKUP ELEMENT (FRAME RATE) | SETTING OF IMAGE PICKUP ELEMENT (IMAGE SIZE) |
|---|---|---|---|---|---|
| DETECTION MODE M1 | WIDE BAND | NO POLARIZATION | BRIGHT FIELD | LOW SPEED | LARGE |
| DETECTION MODE M2 | NARROW BAND A | NO POLARIZATION | BRIGHT FIELD | HIGH SPEED | SMALL |
| DETECTION MODE M3 | WIDE BAND | NO POLARIZATION | DARK FIELD | LOW SPEED | LARGE |
| DETECTION MODE M4 | NARROW BAND B | NO POLARIZATION | BRIGHT FIELD | HIGH SPEED | SMALL |
| DETECTION MODE M5 | NARROW BAND C | LINEAR POLARIZATION | BRIGHT FIELD | LOW SPEED | LARGE |

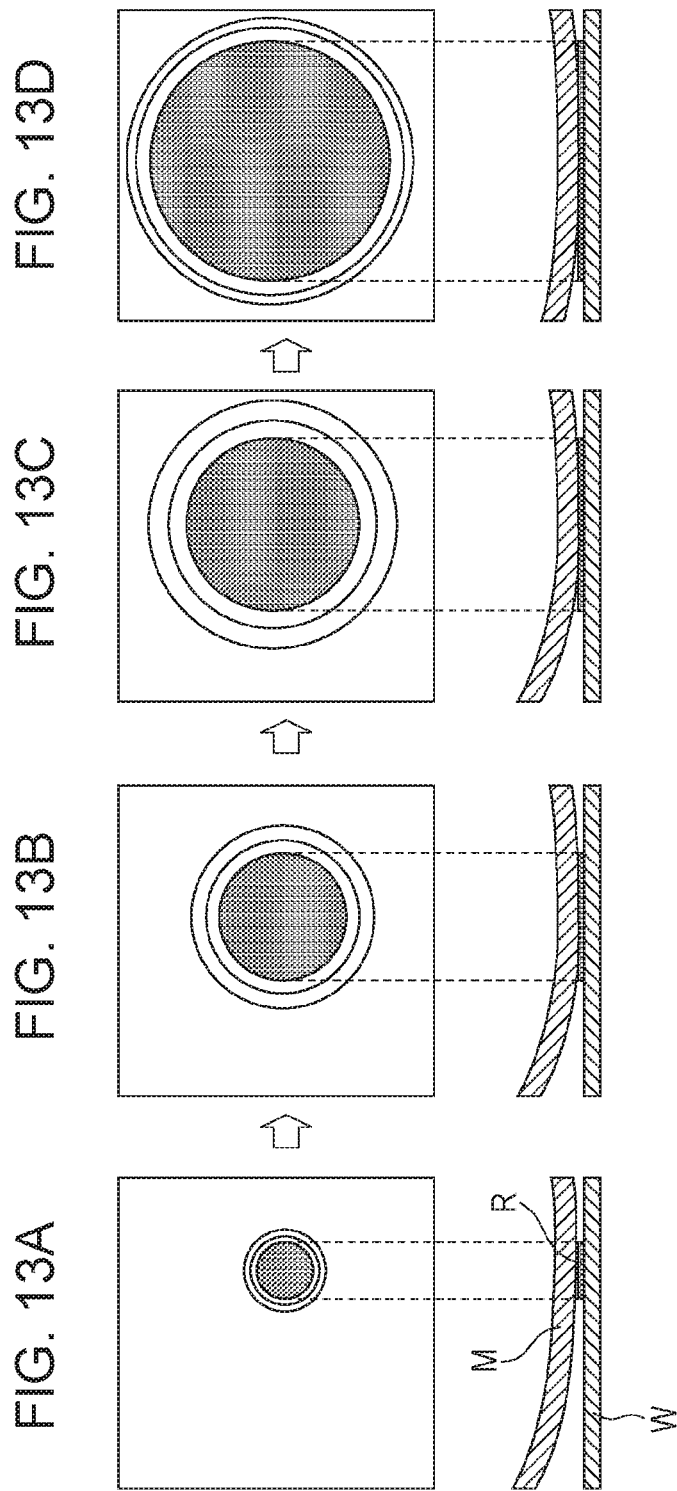

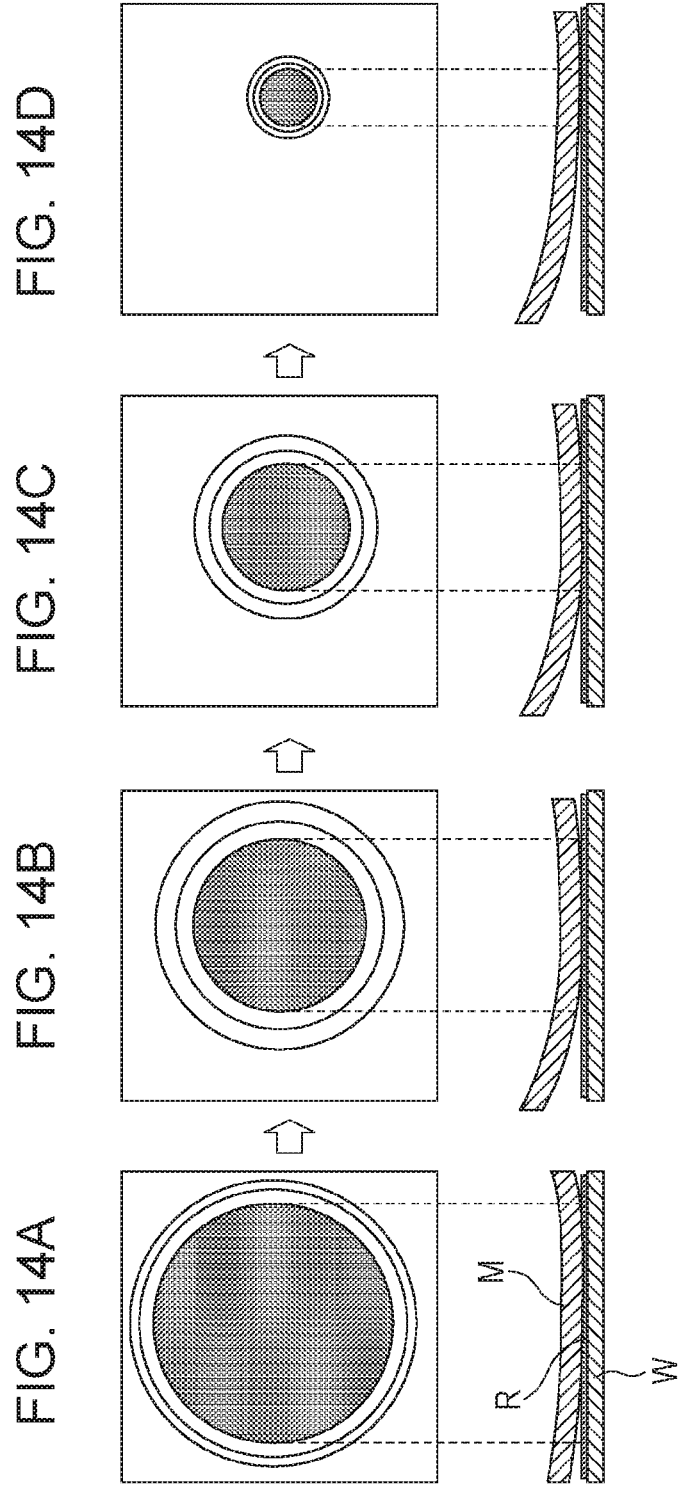

IMPRINTING APPARATUS, IMPRINTING METHOD, AND ARTICLE MANUFACTURING METHOD

TECHNICAL FIELD

The present disclosure relates to an imprinting apparatus, an imprinting method, and an article manufacturing method that detect a state of an imprint material on a substrate.

BACKGROUND ART

An imprinting technique is a technique that transfers a pattern formed in a mold to an imprint material supplied on a substrate. The imprinting technique is proposed as a technique for manufacturing semiconductor devices or magnetic storage media. An imprinting apparatus brings an imprint material (e.g., photo-curable resin) supplied on a substrate and a mold having a pattern into contact, and cures the imprint material while they are in contact with each other. By widening a space between the cured imprint material and the mold to separate the mold from the imprint material, the pattern can be formed in (or transferred to) the imprint material on the substrate.

In the imprinting technique, a contact state between the mold and the imprint material (or substrate) is known to determine the quality of the resulting pattern. Patent Literature 1 proposes a method in which, while a mold and an imprint material are in contact, spreading of droplets of the imprint material supplied on a substrate is observed to determine a contact state between the mold and the substrate.

CITATION LIST

Patent Literature

PTL 1 PCT Japanese Translation Patent Publication No. 2006-514428

When the imprinting apparatus forms a pattern on the substrate, the state of the imprint material changes in accordance with the pattern forming process, that is, from a state where the imprint material is supplied onto the substrate, to a state where the mold is pressed against the imprint material, and then to a state where a pattern of the imprint material is formed. Also, in another pattern forming process, the state of the imprint material changes differently depending on whether the substrate already has a pattern formed thereon. Therefore, in the method for determining the contact state described in Patent Literature 1, if the detection condition for detecting the state of the imprint material is fixed, the detection condition may become unsuitable when the state of the imprint material changes in the pattern forming process and, as a result, the state of the imprint material may not be accurately determined.

SUMMARY OF INVENTION

An imprinting apparatus of the present disclosure is one contacting an imprint material on a substrate with a mold, and forming a pattern of the imprint material on the substrate. The imprinting apparatus is characterized in that it includes a detector configured to irradiate the substrate with light, optically detect reflected light from the substrate to detect a state of the imprint material on the substrate, and switch a detection condition during an imprinting process.

Further features of the present disclosure will become apparent from the following description of exemplary embodiments with reference to the attached drawings.

BRIEF DESCRIPTION OF DRAWINGS

FIG. 12 shows detection modes of the imprinting process, in accordance with one or more aspect of the subject disclosure.

FIGS. 13A to 13D illustrate a cross section of the substrate and the mold and detected interference fringes in an impressing step, in accordance with one or more aspect of the subject disclosure.

FIGS. 14A and 14D illustrate a cross section of the substrate and the mold and detected interference fringes in a mold release step, in accordance with one or more aspect of the subject disclosure.

DESCRIPTION OF EMBODIMENTS

Hereinafter, exemplary embodiments of the present disclosure will be described in detail on the basis of the

First Embodiment

Imprinting Apparatus

Figure 1:
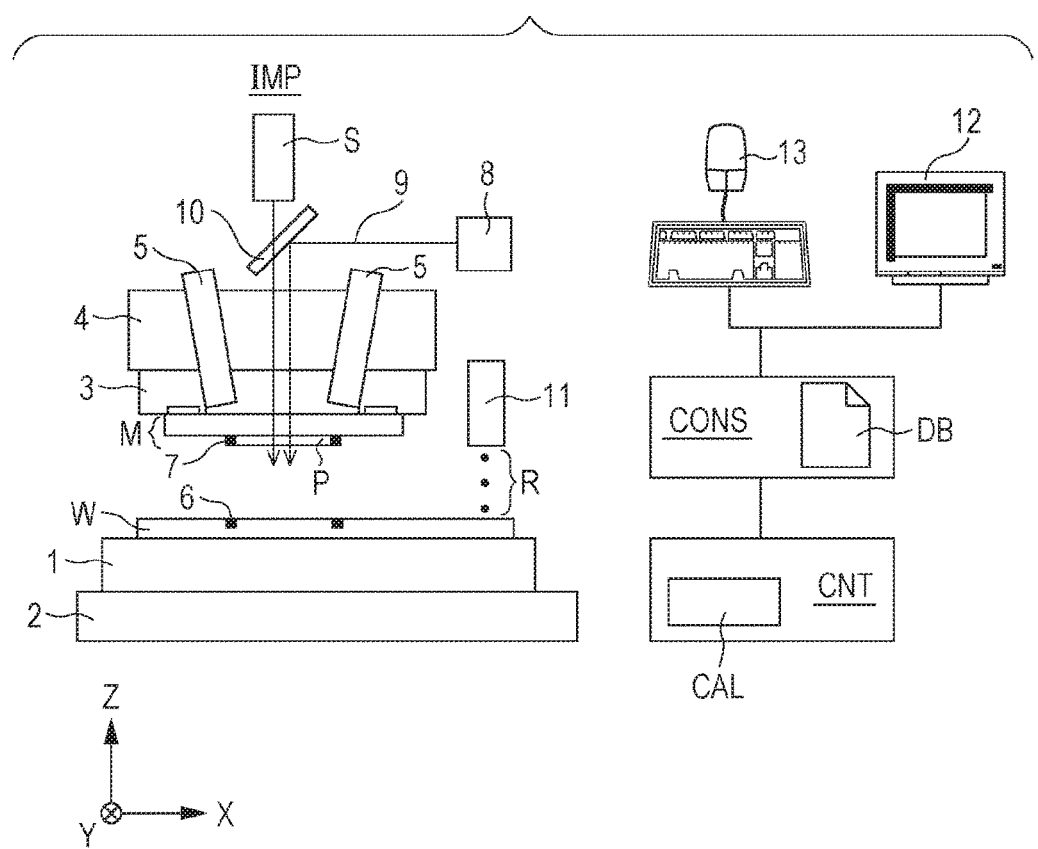
FIG. 1 illustrates an imprinting apparatus, in accordance with one or more aspect of the subject disclosure.

FIG. 1 illustrates an imprinting apparatus IMP of a first embodiment. The imprinting apparatus IMP of the present embodiment includes a substrate holding unit 1 that holds a substrate W, and a substrate stage 2 (substrate driving unit) that supports and moves the substrate holding unit 1. The imprinting apparatus IMP further includes a mold holding unit 3 that holds a mold M having a pattern P formed therein, a mold stage 4 (mold driving unit) that supports and moves the mold holding unit 3, and a supply unit 11 (dispenser) that supplies an imprint material R onto the substrate W. The supply unit 11 may not be included in the imprinting apparatus IMP if the substrate W having the imprint material R supplied thereon is introduced into the imprinting apparatus IMP and subjected to an imprinting process. The imprinting apparatus IMP further includes a controller CNT that controls the imprinting process, a console unit CONS that generates an operation screen of the imprinting apparatus IMP, a display device 12 (output unit) that displays the operation screen, and an input device 13 that includes a keyboard and a mouse. The controller CNT includes a calculating unit CAL.

The imprinting apparatus IMP of the first embodiment is an apparatus that uses a photo-curing method in which the imprint material R is cured by light irradiation. Therefore, a photo-curable resin (ultraviolet curable resin) cured by being irradiated with light (ultraviolet light) is used as the imprint material R. The imprinting apparatus IMP includes a light source 8 that emits light (ultraviolet light 9).

The imprinting apparatus IMP further includes a mark detector 5 (alignment scope). The mark detector 5 detects an alignment mark (substrate-side mark 6) formed in a shot region on the substrate W, and an alignment mark (mold-side mark 7) formed on the mold M.

The imprinting apparatus IMP further includes a detector S that detects light (detection light) from at least one of the shot region and the pattern P by using light (e.g., visible light) having a wavelength different from that of light for curing the imprint material R. The imprinting apparatus IMP further includes an optical element 10 for separating light from the light source 8 and light incident on the detector S. In the imprinting apparatus IMP illustrated in FIG. 1, a dichroic mirror is used as the optical element 10. The dichroic mirror has characteristics of reflecting the ultraviolet light 9 from the light source 8 and transmitting the detection light.

Imprinting Process

Figure 2:
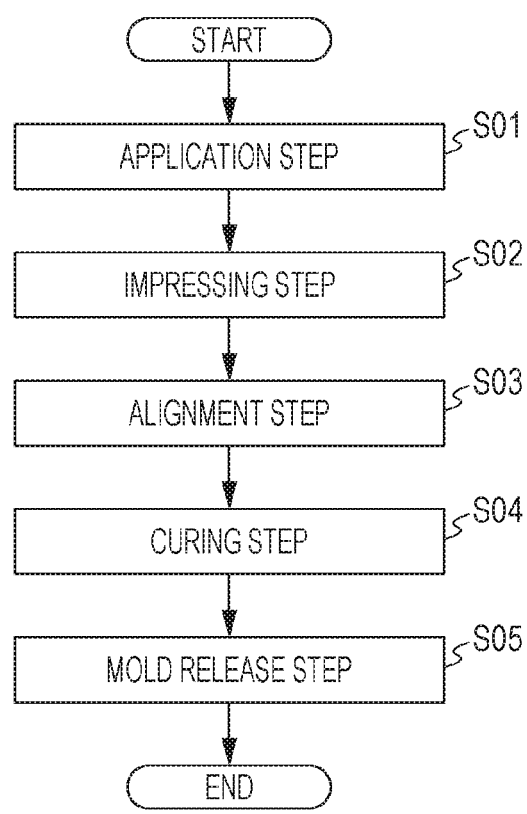
FIG. 2 is a flowchart illustrating an imprinting process, in accordance with one or more aspect of the subject disclosure.

An imprinting process performed in the imprinting apparatus IMP will now be described. FIG. 2 is a flowchart illustrating an imprinting process performed in the imprinting apparatus IMP.

The substrate W introduced into the imprinting apparatus IMP is held by the substrate holding unit 1. To supply (apply) the imprint material R onto the substrate W, the substrate stage 2 moves to bring the substrate W under the supply unit 11. The supply unit 11 ejects the imprint material R to supply the imprint material R onto the substrate W (S01: application step).

To bring the imprint material R supplied on the substrate W and the mold M into contact (i.e., to impress the mold M onto the imprint material R), the substrate stage 2 moves to bring the substrate W under the mold M. By narrowing the space between the substrate W and the mold M to bring the imprint material R and the mold M into contact with each other, the imprint material R is charged into the pattern P of the mold M (S02: impressing step).

The mold M has, on the opposite side of the pattern P, a recessed portion in a region larger than that of the pattern P. In the center of the mold holding unit 3, a portion which allows passage of the ultraviolet light 9 from the light source 8 is provided, and an enclosed space (cavity portion) is defined by the mold M and a seal glass member (not shown). A pressure controller (not shown) is connected to the enclosed space, so that pressure in the enclosed space can be controlled in the impressing step. The pressure controller is capable of raising pressure in the enclosed space to deform the mold M into a convex shape toward the substrate W. After the mold M and the imprint material R come into contact, the pressure controller lowers the pressure in the enclosed space to bring the pattern P of the mold M and the imprint material R into contact. By bringing the mold M and the imprint material R into contact while the mold M is being deformed in a convex shape, the imprinting apparatus IMP can reduce trapping of air bubbles between the substrate W and the mold M.

The calculating unit CAL of the controller CNT determines a relative positional gap between the substrate W and the mold M from the substrate-side mark 6 and the mold-side mark 7 detected by the mark detector 5. On the basis of the determined relative positional gap, the controller CNT controls the substrate stage 2 and the mold stage 4 to reduce the positional gap, so that the substrate W and the mold M are aligned with each other. The relative positional gap includes a shift component, a scaling factor, and a rotational component. The imprinting apparatus IMP is capable of correcting the shape of the pattern P (pattern region) of the mold M in accordance with the shot region formed on the substrate W (S03: alignment step). The alignment step may start either before, or in the middle of, the impressing step.

After alignment of the substrate W and the mold M, the imprint material R is cured by being irradiated with the ultraviolet light 9 from the light source 8 (S04: curing step).

Then, by separating the mold M from the cured imprint material R, a pattern is formed in the imprint material on the substrate W (S05: mold release step). By repeating the sequence of the steps of the imprinting process described above, a pattern can be formed in a plurality of shot regions on the substrate W.

Detection of Contact State

In the imprinting apparatus IMP of the first embodiment, the detector S detects light from the substrate W in the imprinting process, so that a state of the imprint material R can be observed. Here, a contact state between the mold M and the imprint material R is observed by detecting the state of the imprint material. A description will now be given of how the detector S detects reflected light from the substrate W.

The detector S emits light for illuminating the substrate W. After illumination of the substrate W, the light is reflected off the surface of the substrate W and the pattern surface of the mold M, and the reflected light from the substrate W and the reflected light from the mold M are detected as detection light by the detector S. As described above, since the mold M is in a convex shape in the impressing step, the distance between the mold M and the substrate W continuously changes from a portion where the mold M and the imprint material R are in contact. Interference fringes (so-called Newton's rings) are thus detected by the detector S.

Figure 3:
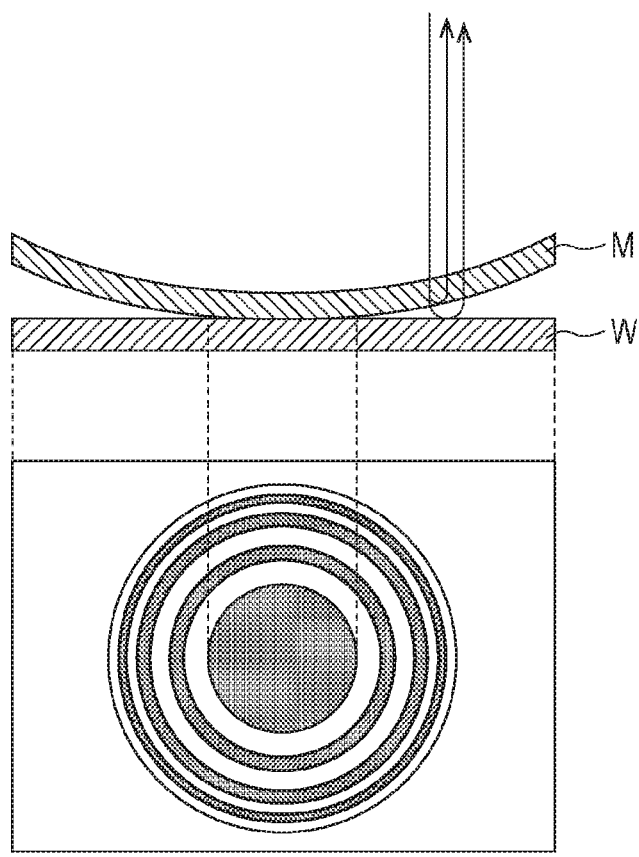
FIG. 3 illustrates a cross section of a mold and a substrate, and interference fringes detected by a detector, in accordance with one or more aspect of the subject disclosure.

FIG. 3 illustrates a cross section of the mold M and the substrate W in the impressing step, and interference fringes detected by the detector S in the impressing step. From the detected interference fringes, the controller CNT can determine whether the state of the imprint material is good. Also, by observing the contact state between the mold M and the imprint material R, it is possible to detect the position of the mold M and the substrate W when the mold M and the imprint material R are in contact. The detector S of the first embodiment does not require an optical system with high optical performance, as long as it has an optical system capable of detecting interference fringes. Even in the mold release step of widening the space between the mold M and the substrate W, the detector S can detect interference fringes as in the contact step. Thus, by observing the contact state between the mold M and the imprint material R during mold release, the position of the mold M and the substrate W during mold release can be detected.

Figure 4:
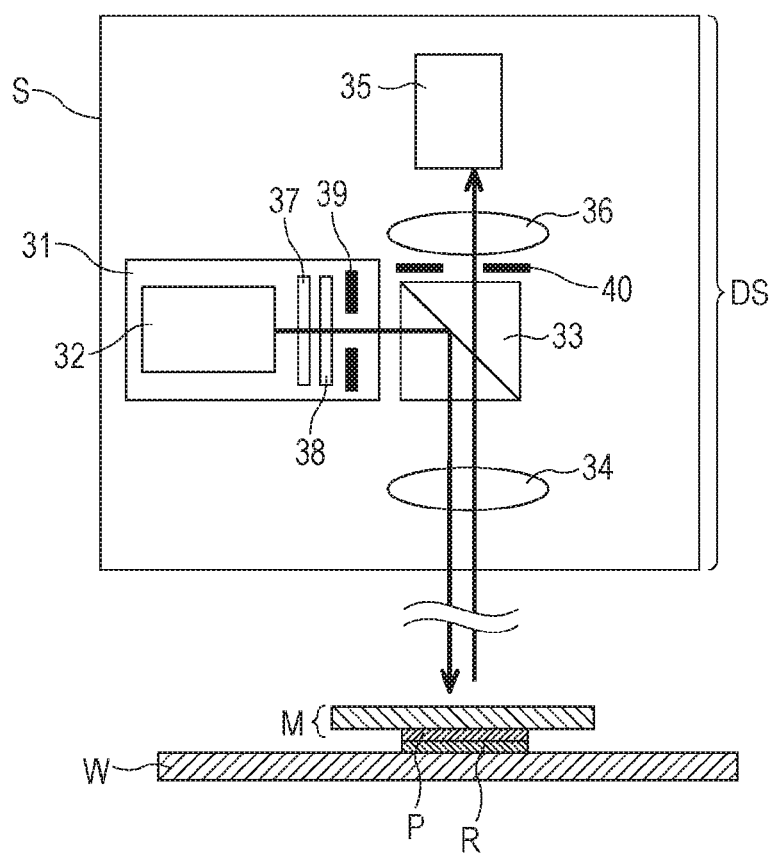
FIG. 4 illustrates the detector of the first embodiment, in accordance with one or more aspect of the subject disclosure.

FIG. 4 illustrates the detector S of the first embodiment. The mold holding unit 3, the mold stage 4, and the optical element 10 are not shown in FIG. 4. The detector S includes an illuminating unit 31 that illuminates the mold M and the substrate W. The illuminating unit 31 includes a light source 32 for illumination, and illuminating light is emitted from the light source 32. The illuminating light from the light source 32 is reflected off a beam splitter 33, transmitted through a lens 34, and applied onto the substrate W. The beam splitter 33 is, for example, a half mirror, which may be a cube-type beam splitter such as that illustrated in FIG. 4 or may be a plate-type beam splitter. The illuminating light from the illuminating unit 31 is reflected off the substrate W, transmitted through the lens 34 and the beam splitter 33 as detection light, and focused by a lens 36 onto a light receiving surface of an image pickup element 35 (image pickup unit). The lens 34 and the lens 36 allow the light receiving surface of the image pickup element 35 to be optically conjugate with the pattern P of the mold M in contact with the imprint material R and the surface of the substrate W. The light receiving surface of the image pickup element 35 is configured to allow observation of the entire or part of the shot region. On the basis of an image detected by the image pickup element 35, the contact state between the substrate W and the mold M, and between the imprint material R on the substrate W and the mold M, can be observed.

The illuminating unit 31 further includes a wavelength switching mechanism 37, a polarization switching mechanism 38, an illumination-mode switching mechanism 39, and an aperture stop 40. The aperture stop 40 is disposed in a pupil plane of the lens 36. The wavelength switching mechanism 37, the polarization switching mechanism 38, and the illumination-mode switching mechanism 39 are located between the light source 32 and the beam splitter 33, and are each disposed in, or in the vicinity of, a plane conjugate with the pupil plane of the lens 36. The wavelength switching mechanism 37, the polarization switching mechanism 38, and the illumination-mode switching mechanism 39 are each capable of switching a detection condition of the detector S, and adjusting an image detected by the image pickup element 35. Effects of these switching mechanisms will now be described.

Wavelength Switching Mechanism for Detector

The light source 32 for illumination according to the first embodiment is an emission lamp, such as a halogen lamp, a xenon lamp, or a metal halide lamp, and emits light having a wide wavelength band. For observation of a contact state between the mold M and the imprint material R, the detector S detects interference fringes formed by reflected light from the mold M and the substrate W. In the case of $2d=m\lambda$ (m is a natural number), where d represents the distance between the mold M and the substrate W and $\lambda$ represents the wavelength of illuminating light, reflected light from the mold M and reflected light from the substrate W reinforce each other to allow bright rings to be observed, whereas in the case of $2d=(m+1/2)\lambda$, reflected light from the mold M and reflected light from the substrate W cancel each other to allow dark rings to be observed. When the mold M and the substrate W are illuminated with white light having a wide wavelength band, the pitches of observed interference fringes overlap each other with a slight displacement for each wavelength. Since this lowers the contrast of the interference fringes, it is desirable that the wavelength band of illuminating light be narrow.

Figure 5A:
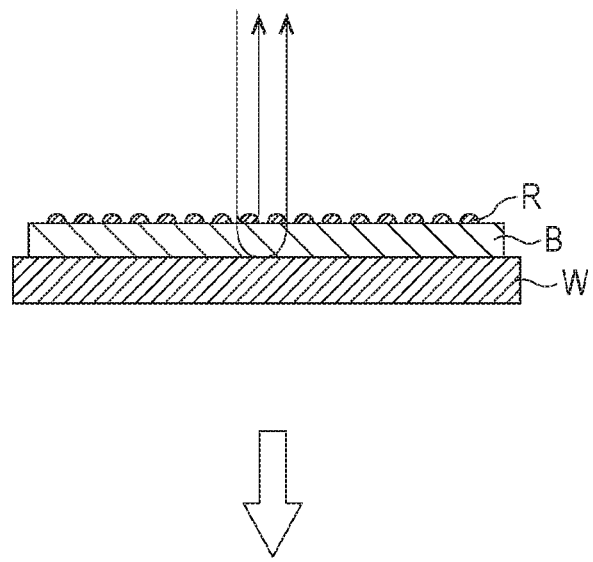
FIGS. 5A and 5B illustrate interference caused by reflected light from a substrate and a base layer, in accordance with one or more aspect of the subject disclosure.
Figure 5B:
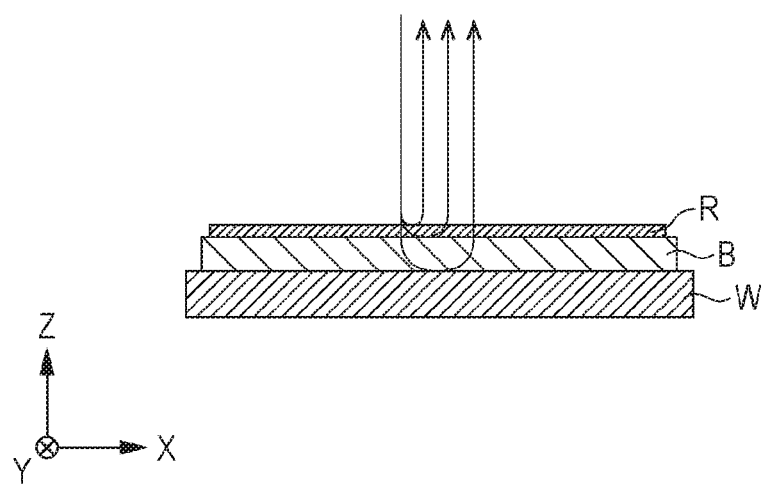

FIGS. 5A and 5B illustrate the substrate W having a base layer B formed thereon. The substrate W may have a plurality of base layers B formed thereon for manufacture of a semiconductor device. In FIGS. 5A and 5B, the substrate W has a single base layer B formed thereon. Interference of reflected light from the substrate W and reflected light from the surface of the base layer B in FIG. 5A can be considered similarly to the case of interference fringes formed by reflected light from the mold M and reflected light from the substrate W. In the case of $2nt=m\lambda$, where n and t represent the refractive index and the thickness, respectively, of the base layer B, the reflectivity of the entire substrate W is high because reflected light from the substrate W and reflected light from the surface of the base layer B reinforce each other. In the case of $2nt=(m+1/2)\lambda$, the reflectivity of the entire substrate W is low because reflected light from the substrate W and reflected light from the surface of the base layer B cancel each other.

Figure 6:
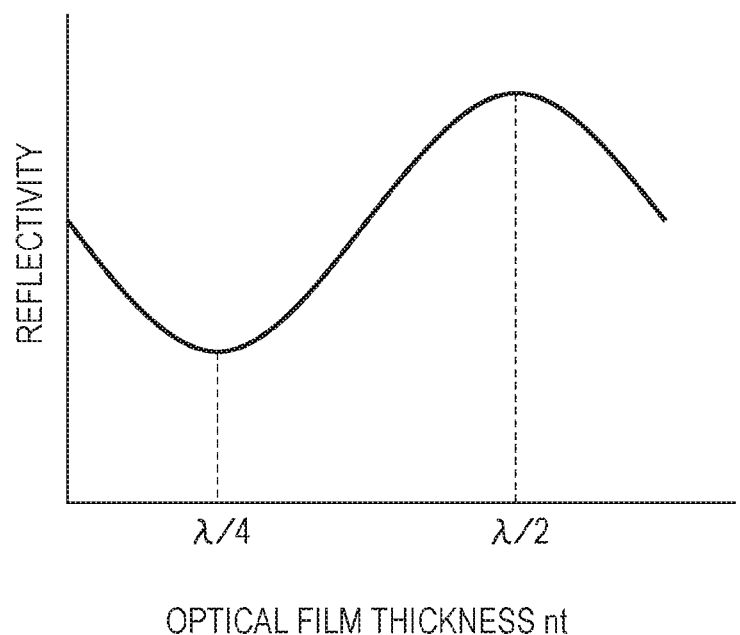
FIG. 6 shows a relationship between optical film thickness and reflectivity, in accordance with one or more aspect of the subject disclosure.

Therefore, as shown in FIG. 6, the reflectivity of the entire substrate W varies depending on an optical film thickness nt of the base layer B. An actual base layer B is formed by a laminate of many layers, and interference may be considered for each layer. In the base layer B formed by a laminate of many layers, interference occurs in a different layer depending on the wavelength of illuminating light, and this results in varying reflectivity of the entire substrate W. As the reflectivity of the entire substrate W decreases, the contrast of interference fringes is lowered. Therefore, it is desirable to select a wavelength which provides high reflectivity of the entire substrate W.

Since the imprint material R is not spread out on the substrate W before contact between the mold M and the imprint material R (i.e., before the impressing step), the reflectivity of the substrate W can be determined by taking into account interference on only the substrate W and the base layer B. However, since the imprint material R is spread out on the substrate W after mold release between the mold M and the imprint material R, an interference state before the contact and that after the mold release are different, as in FIG. 5A illustrating an interference state before the contact and FIG. 5B illustrating an interference state after the mold release. Therefore, since a wavelength that maximizes reflectivity of the entire substrate W changes, it is desirable that the wavelength of illuminating light be switched between that before the contact and that after the mold release. By detecting light from the substrate W after the mold release, the detector S can observe a pattern state of the imprint material R formed on the substrate. For example, the detector S detects the presence or absence of defects in an indented pattern transferred onto the substrate W, so as to determine whether the pattern formation is good.

The detector S of the first embodiment includes the wavelength switching mechanism 37 for selecting the wavelength of illuminating light as an irradiation condition. The wavelength switching mechanism 37 is formed by a bandpass filter, or a long-wavelength cut filter and a short-wavelength cut filter, mounted on a turret or slide mechanism (not shown). The wavelength switching mechanism 37 can select the wavelength of light from the light source 32 by switching the filter on the optical path of illuminating light. Thus, for the substrate W having various bases formed thereon, the detector S of the first embodiment can detect detection light under optimum conditions. Also, the detector S can detect detection light under optimum irradiation conditions both before the contact and after the mold release.

Although the light source 32 described in the first embodiment is a lamp that emits light having a wide band, the present disclosure is not limited by the type of light source. For example, the light source may be one that emits light having a narrow band, such as an LED. Instead of selecting the wavelength of illuminating light, the wavelength switching mechanism 37 may select, from a plurality of LEDs having different emission center wavelengths and arranged as a light source, an LED to be used for illumination so as to select the wavelength of illuminating light.

Although the illuminating light of the detector S is visible light in the first embodiment, any light can be used, as long as it is not light that cures the imprint material R. For example, the illuminating light of the detector S may be infrared light.

Polarization Switching Mechanism for Detector

The base layer B formed on the substrate W may have a pattern formed therein. For example, the base layer B may have a line-and-space (L/S) pattern extending in one direction, and the pitch of the L/S pattern may be shorter than the wavelength of illuminating light emitted from the detector S. The effective refractive index of a pattern with structures smaller than the wavelength of the illuminating light varies depending on the refractive index of the structures, the pitch, line width, and depth of the structures, and the polarization direction of incident light.

Figure 7A:
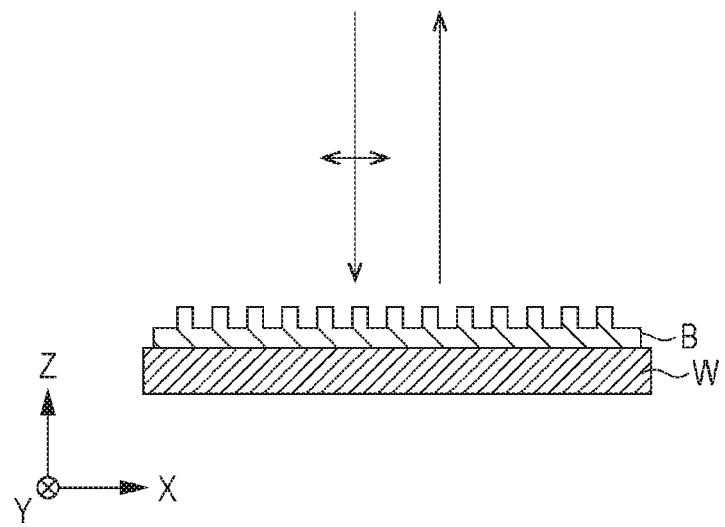
FIGS. 7A and 7B illustrate a difference in reflected light caused by a difference in the polarization of illuminating light, in accordance with one or more aspect of the subject disclosure.
Figure 7B:
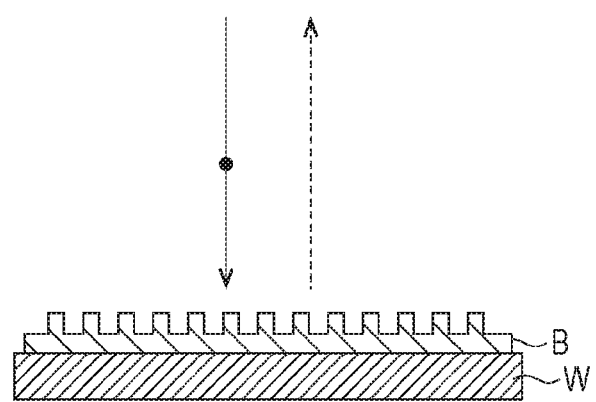

FIGS. 7A and 7B illustrate reflected light obtained when polarized light is incident on a pattern with structures smaller than the wavelength of illuminating light. FIG. 7A illustrates a case where a pitch direction of the pattern (X axis) and a vibration direction of an electric field vector of illuminating light (polarization direction) are parallel to each other. FIG. 7B illustrates a case where the pitch direction of the pattern (X axis) and the polarization direction of illuminating light (Y axis) are perpendicular to each other. Reflectivity in the case where the pitch direction of the pattern and the polarization direction of the illuminating light are parallel to each other is higher than that in the case where they are perpendicular to each other. As described above, the reflectivity of the entire substrate W varies depending on the pitch direction of the L/S pattern and the polarization direction (polarization state) of illuminating light.

To detect interference fringes formed by reflected light from the mold M and reflected light from the substrate W with high contrast, it is desirable to illuminate the substrate W with light having a polarization direction that maximizes the reflectivity of the entire substrate W. In FIGS. 7A and 7B, the polarization direction of illuminating light is determined in accordance with the pitch direction of the L/S pattern formed in the base layer B. However, after a pattern different from that in the base layer B is formed by an imprinting process, it is desirable that the polarization direction of illuminating light from the detector S be switched in accordance with the newly formed pattern.

The imprinting apparatus of the first embodiment includes the polarization switching mechanism 38 for switching the polarization direction of illuminating light. The light source 32 for the detector S of the first embodiment is an emission lamp, such as a halogen lamp, and emits randomly polarized light. The polarization switching mechanism 38 is formed by a plurality of polarizers mounted on a turret or slide mechanism (not shown). The polarizers convert the polarization direction of illuminating light to a linear polarization direction. The polarizers are inserted into and retracted from the optical path of illuminating light, so that the polarization direction of illuminating light can be converted to any linear polarization direction. The polarizers for conversion to linearly polarized light may be mounted on a rotating mechanism such that they are rotatable about the optical axis of illuminating light. A polarization direction changing unit may be used, which is formed by polarizers arranged on the optical path of illuminating light and a ½ wavelength plate rotatable about the optical axis. To emit randomly polarized light from the light source 32 of the detector S without converting it, the polarizers may be retracted from the optical path of illuminating light. The irradiation condition of light for irradiating the substrate is switched by switching the polarization direction of the light for irradiating the substrate.

The detector S further includes a ¼ wavelength plate (not shown) between the beam splitter 33 and the image pickup element 35. Illuminating light converted to linearly polarized light by the polarization switching mechanism 38 is reflected off the beam splitter 33, transmitted through the lens 34, and applied to the substrate W. The illuminating light is reflected off the substrate W, transmitted through the beam splitter 33, and is incident on the ¼ wavelength plate. The linearly polarized light incident on the ¼ wavelength plate is converted to circularly polarized light, and focused by the lens 36 onto the light receiving surface of the image pickup element 35. Although a polarizing plate, a polarization beam splitter formed by a dielectric multilayer film, a wire-grid polarizer, a calcite prism, or the like may be used as a polarizer, the present disclosure is not limited by the type of polarizer.

Although the polarization switching mechanism 38 of the first embodiment is disposed on the optical path of illuminating light, the polarization switching mechanism 38 may be disposed on the optical path of detection light. In this case, the polarization switching mechanism 38 is disposed near the pupil plane of the lens 36 between the beam splitter 33 and the image pickup element 35, and converts the detection light to linearly polarized light of any polarization direction. A ¼ wavelength plate is disposed between the polarization switching mechanism 38 and the image pickup element 35, and converts the linearly polarized detection light to circularly polarized light.

If the light source 32 for the detector S is a light source that emits linearly polarized light, such as a laser, the polarization switching mechanism 38 includes a ½ wavelength plate, so that illuminating light can be converted to linearly polarized light of any polarization direction depending on the relationship between the direction of polarized light from the light source and the direction of the slow axis of the ½ wavelength plate. For illumination with circularly polarized light, a ¼ wavelength plate, instead of the ½ wavelength plate, may be inserted into the optical path of illuminating light. Linearly polarized light from the light source 32 is converted to circularly polarized light by the ¼ wavelength plate of the polarization switching mechanism 38. For illumination with randomly polarized light, a depolarizing plate may be used, which is obtained by combining a wedge substrate formed by a birefringent member, such as a crystal, with a wedge substrate, such as a quartz substrate.

As described above, even for the substrate W having various patterns formed thereon, the detector S of the first embodiment can detect light from the imprint material R on the substrate W under optimum conditions, both before the impressing step and after the mold release step. Thus, it is possible to observe, with accuracy, the state of the imprint material R on the substrate W and the contact state between the imprint material R on the substrate W and the mold M.

Switching of Illumination Mode

The substrate W may be provided with the base layer B that absorbs illuminating light from the detector S. Since the reflectivity of the substrate W is low in this case, interference fringes formed by reflected light from the mold M and the substrate W may not be detected. In such a case, the contact state between the mold M and the imprint material R may be observed by switching the illumination mode for illuminating the substrate W from bright-field illumination to dark-field illumination.

Figure 8:
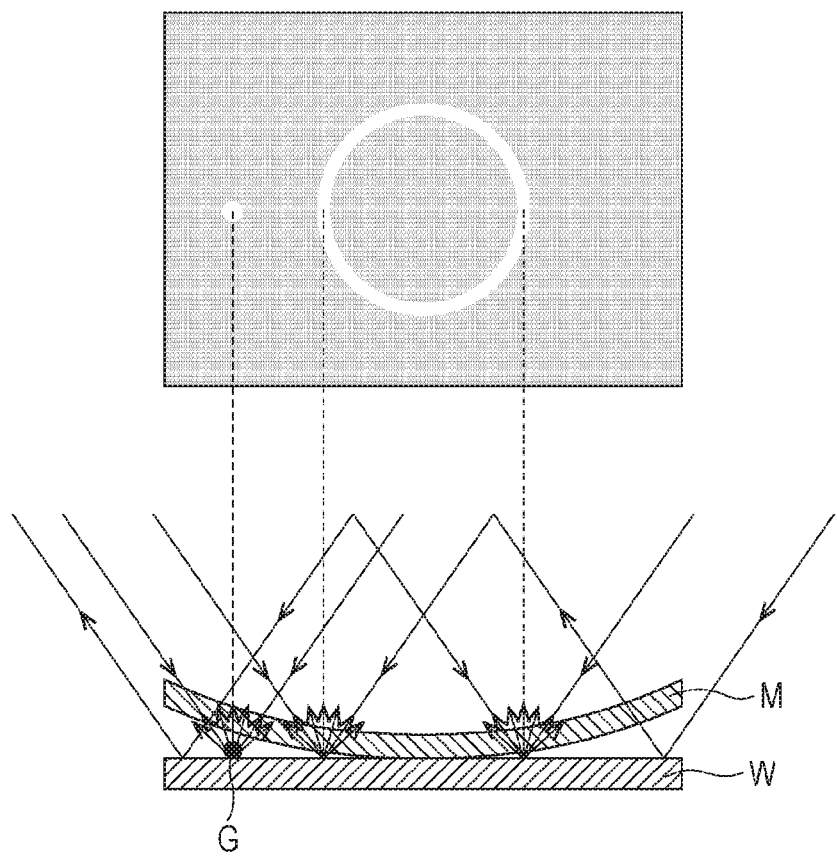
FIG. 8 illustrates scattered light and a detected image obtained when the substrate is illuminated with dark-field illumination, in accordance with one or more aspect of the subject disclosure.

FIG. 8 illustrates a cross section of the substrate W and the mold M and an image detected by the detector S when the substrate W is illuminated with dark-field illumination. By illuminating the substrate W with dark-field illumination, scattered light from the boundary of contact surfaces of the mold M and the imprint material R (or the substrate W in FIG. 8) can be detected, and this allows observation of the contact state between the mold M and the imprint material R. When there is dust G on the substrate W, the detector S can detect scattered light from the dust G, and thus can detect the presence or absence of the dust G before the mold M and the imprint material R are brought into contact. Bright-field illumination requires the detector S to have a resolution sufficient for resolving the dust G. In dark-field illumination, the detector S does not necessarily need to resolve the dust G, as long as it can detect scattered light. Therefore, with dark-field illumination, dust particles smaller than in the case of bright-field illumination may be detected.

The detector S of the first embodiment includes the illumination-mode switching mechanism 39 for switching between bright-field illumination and dark-field illumination. The illumination-mode switching mechanism 39 includes an illumination stop mounted on a turret or slide mechanism (not shown). The illumination stop is disposed in a plane optically conjugate with the pupil plane of the lens 36, and determines the shape of an illumination pupil. In bright-field illumination, as illustrated in FIG. 4, the illumination stop transmits only light spatially smaller than the aperture stop 40 disposed in the pupil plane of the lens 36, and blocks light larger than the aperture stop 40. Conversely, in dark-field illumination, the illumination stop transmits only light spatially larger than the aperture stop 40 and blocks light smaller than the aperture stop.

Figure 9:
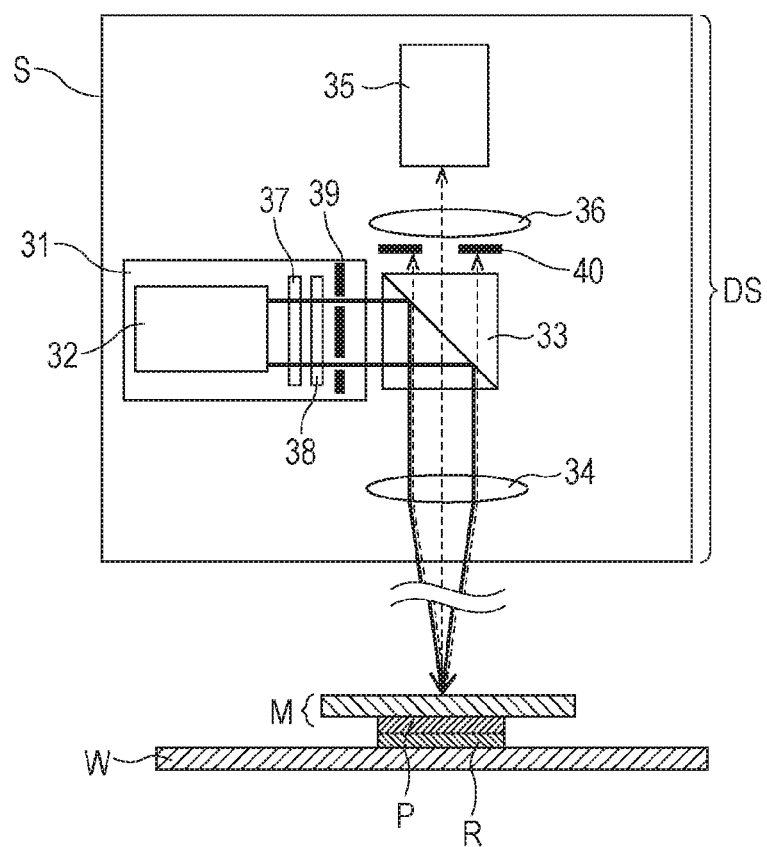
FIG. 9 illustrates the detector when dark-field illumination is used, in accordance with one or more aspect of the subject disclosure.

FIG. 9 illustrates the illumination-mode switching mechanism 39 when the illumination mode (irradiation condition) of the detector S is dark-field illumination. In bright-field illumination, illuminating light from the illuminating unit 31 may be reflected off the lens 34 and may be directly incident on the light receiving surface of the image pickup element 35. Such flare light causes degradation of a detected image. In particular, since flare light reflected at the center of the lens 34 cannot be blocked by a stop or the like, it is difficult to prevent occurrence of flare light. When the reflectivity of the substrate W is low, the intensity of flare light is relatively high, and this affects a detection result by the detector S.

In dark-field illumination, flare light reflected at the center of the lens 34 is blocked by the aperture stop 40 or the like, and is not incident on the light receiving surface of the image pickup element 35. Therefore, in dark-field illumination, it is possible to reduce occurrence of flare light which affects a detection result.

As described above, the detector S of the first embodiment is capable of switching the illumination mode between bright-field illumination and dark-field illumination. Therefore, for various types of substrates W with different reflectivities, the detector S can detect the contact state between the mold M and the imprint material R under optimum conditions. Also, since the presence of the dust G on the substrate W can be detected before the mold M and the imprint material R are brought into contact, it is possible to prevent contact between the mold M and the dust G.

In the embodiment described above, as a detection condition for detecting the state of the imprint material on the substrate, an irradiation condition of light for irradiating the substrate is switched. The detection condition is not limited to the irradiation condition, and may be a light receiving condition for receiving reflected light from the substrate. For example, of reflected light from the substrate, zero-order diffracted light or first-order diffracted light is transmitted by switching the aperture stop 40, so that diffracted light of different orders can be detected by a light receiving element. The aperture stop 40 includes a stop that transmits and blocks regular reflected light and diffracted light, respectively, of reflected light from the substrate, and another stop that transmits and blocks diffracted light and regular reflected light, respectively, of reflected light from the substrate. An aperture stop driving mechanism switches the position of the stops.

The detector S in the imprinting apparatus of the first embodiment includes the wavelength switching mechanism 37, the polarization switching mechanism 38, and the illumination-mode switching mechanism 39. However, the detector S does not necessarily need to include all the switching mechanisms, as long as it includes at least one of them. The irradiation condition of light for irradiating the substrate may be determined by combining wavelength switching, polarization switching, and illumination mode switching.

Second Embodiment

Figure 10A:
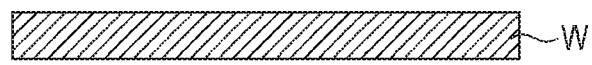
FIGS. 10A to 10F illustrate a state of a substrate surface in each step of an imprinting process, in accordance with one or more aspect of the subject disclosure.

FIGS. 10A to 10F illustrate how the surface state of the substrate W changes in accordance with an imprinting process. The imprinting process is performed by driving the driving units, such as the substrate stage 2 and the mold stage 4. Therefore, the state of the imprint material on the substrate changes in accordance with a driving sequence of the driving units. FIG. 10A illustrates a surface state of the substrate W at the start of the imprinting process. Nothing has been done on the substrate W.

Figure 10B:

FIG. 10B illustrates a surface state of the substrate W in the application step of S01 described with reference to FIG. 2. Droplets of the imprint material R are applied onto the substrate W.

Figure 10C:
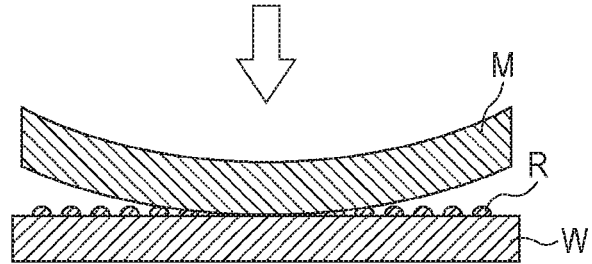

FIG. 10C illustrates a surface state of the substrate W in the impressing step of S02 described with reference to FIG. 2. In the impressing step of S02, the mold M is brought close to the substrate W, with the center of the mold M deformed in a convex shape, to bring the mold M into contact with the imprint material R gradually from the center toward the edge of the mold M. This makes it possible to prevent air bubbles from remaining between the mold M and the substrate W. In the impressing step of S02, where the mold M is pressed against the substrate W while being deformed in a convex shape, interference fringes formed by light interference are observed, as illustrated in FIG. 3, in the region where the mold M and the imprint material R are in contact and its surrounding region.

Figure 10D:
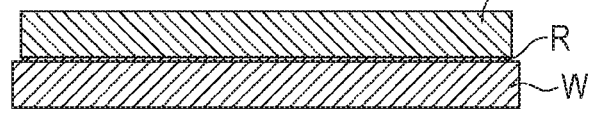

FIG. 10D illustrates a surface state of the substrate W in the curing step of S04 described with reference to FIG. 2. The imprint material R is charged between the mold M and the substrate W.

Figure 10E:
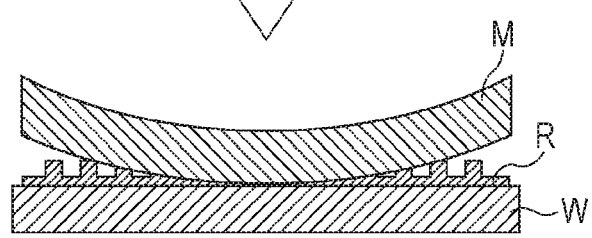

FIG. 10E illustrates a surface state of the substrate W in the mold release step of S05 described with reference to FIG. 2. In the mold release step of S05, for reduction of a release force for removing the mold M from the cured imprint material R, the mold M is separated from the substrate W while the center of the mold M is being deformed into a convex shape. In the mold release step, the substrate W may be deformed into a convex shape toward the mold M. Thus, in the mold release step of S05, as in the impressing step of S02, interference fringes formed by light interference are observed in the region where the mold M and the imprint material R are in contact and its surrounding region, as illustrated in FIG. 3.

Figure 10F:
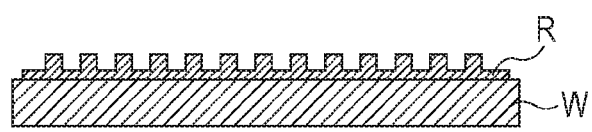

FIG. 10F illustrates a surface state of the substrate W at the end of the imprinting process. A pattern of the imprint material R is formed on the substrate W.

As described above, a surface state of the substrate W (or a state of the imprint material on the substrate) changes in accordance with the steps included in the imprinting process. In a conventional method for detecting a surface state of the substrate W, even though the surface state of the substrate W changes, the setting of the detector S is fixed at a detection condition suitable for a specific step (e.g., the impressing step of S02). As a result, the surface state of the substrate W cannot be accurately detected in other steps (e.g., in steps other than the impressing step of S02).

Figure 11:
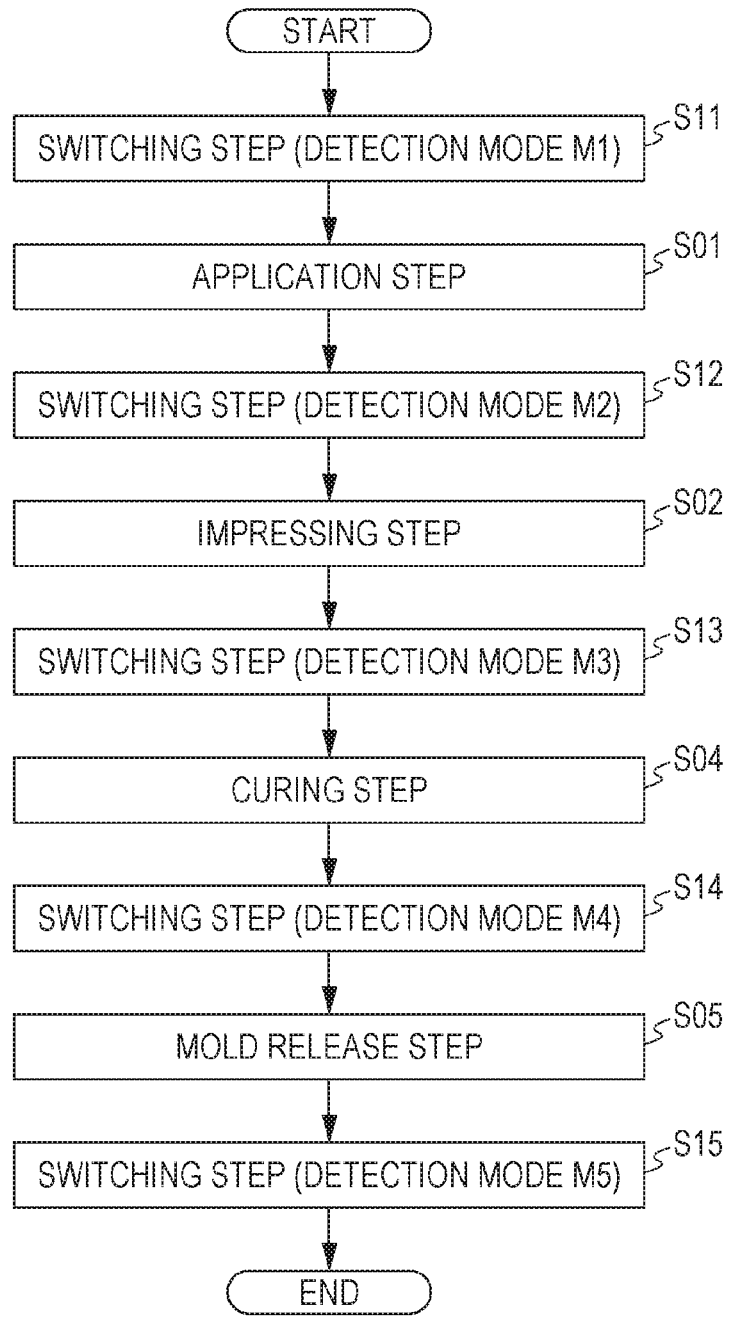
FIG. 11 is a flowchart illustrating an imprinting process, in accordance with one or more aspect of the subject disclosure.

FIG. 11 is a flowchart illustrating an imprinting process of a second embodiment. Here, a detection condition of the detector S is switched for each step of the normal imprinting process illustrated in FIG. 2.

A detection condition is formed by combination of settings of individual detector subunits DS, such as the wavelength switching mechanism 37, the polarization switching mechanism 38, the illumination-mode switching mechanism 39, and the image pickup element 35, included in the detector S illustrated in FIG. 4. Detection modes, each obtained by combination of settings of the individual detector subunits DS, are provided. The detection condition is switched by switching the detection mode.

FIG. 12 shows exemplary detection modes. Each detection mode includes settings of the individual detector subunits DS. The number of the detector subunits DS may be increased or decreased, and the number of detection mode settings taken by each detector subunit may be increased or decreased. By preparing the detection modes as described above, a detection condition suitable for the state of the substrate W can be switched efficiently.

In accordance with the flowchart of FIG. 11, an operation of switching the detection mode for each step of the imprinting process will be described.

In an imprinting method of the second embodiment, when the imprinting process starts, the detection condition of the detector is switched (or set) to detection mode M1 in a switching step of S11 (detection mode M1). After the detection condition of the detector is switched to detection mode M1, a surface state of the substrate W in the application step (S01) where the imprint material R is applied onto the substrate W is detected. In the application step of S01, clogging of the dispenser or the like may cause improper application of the imprint material R, and droplets of the imprint material R may not be applied (placed) at predetermined positions on the substrate W. Therefore, in detection mode M1, the size of an image to be detected is increased and resolution per unit pixel of the image is made finer in the image pickup element 35, which is a detector subunit DS, to facilitate observation of the state of application of droplets of the imprint material R. The wavelength switching mechanism 37 uses a wide band of wavelengths so that it is less affected by the size and shape of droplets of the imprint material R.

After the application step of S01, the detection condition is switched to detection mode M2 in a switching step of S12 (detection mode M2), the detection condition is switched to detection mode M2. After the detection condition of the detector is switched to detection mode M2, a surface state of the substrate W in the impressing step (S02) where the imprint material R and the mold M are brought into contact is detected. In the impressing step of S02, the mold M may come into contact with the imprint material R on the substrate W while the mold M is in a tilted position. If the mold M comes into contact with the imprint material R while being in a tilted position, the pattern P formed in the mold M may not be properly formed on the substrate W.

Therefore, in detection mode M2, the wavelength switching mechanism 37 uses a narrow band of wavelengths which provide a high contrast of interference fringes, and the image pickup element 35 selects a high frame rate for an image to be detected. FIGS. 13A to 13D illustrate a cross section of the mold M and the substrate W and an image picked up by the image pickup element when the impressing step of S02 is observed in detection mode M2. The image picked up by the image pickup element is output to an output unit, such as the display device 12, so that the contact state between the imprint material R and the substrate W can be observed. If the mold M comes into contact with the imprint material R while being tilted with respect to the substrate W, the center position of the interference fringes appears to be off the center position of the mold M (FIG. 13A). When the wavelength switching mechanism 37 uses a narrow band of wavelengths, the center position of the interference fringes can be clearly identified and the position of the mold M can be observed. When the position of the mold M is controlled from the center position of interference fringes, the image pickup element 35 selects a high frame rate for image acquisition, so that the position of the mold M can be controlled with higher frequency. The impressing step of S02 may include the alignment step (S03) where the mold M and the substrate W are brought into alignment using a detection result obtained in detection mode M2.

After the impressing step of S02, the detection condition is switched to detection mode M3 in a switching step of S13 (detection mode M3). After the detection condition of the detector is switched to detection mode M3, the state of the substrate W is detected in the curing step (S04) where the imprint material R is cured by irradiating the imprint material R with light. In the curing step of S04, it is necessary that there be no dust G on the substrate W and the imprint material R formed on the substrate W be evenly charged over the entire shot region (pattern region of the mold M).

Therefore, in detection mode M3, the illumination-mode switching mechanism 39 selects dark-field illumination and the image pickup element 35 increases the size of an image to be detected. If the dust G adheres to the surface of the substrate W when dark-field illumination is used, scattered light emerges from the dust G as illustrated in FIG. 8. The image pickup element 35 detects the scattered light and allows determination of the presence of the dust G. By increasing the image size in the image pickup element 35, the resolution per pixel is increased and the dust G of smaller sizes can be detected. If the imprint material R on the substrate W and the mold M are brought into contact while the dust G adheres to the surface of the substrate W, the pattern P in the mold M may be damaged by the dust G.

In the impressing step of S02, the imprinting operation can be stopped by detecting the dust G before the mold M and the dust G come into contact. Specifically, after the presence or absence of the dust G is detected, the controller determines to stop the imprinting operation if there is adherence of the dust G, and determines to continue the imprinting operation if there is no adherence of the dust G. It is thus possible to prevent contact between the mold M and the dust G, and prevent the resulting damage to the pattern P in the mold M.

After the curing step of S04, the detection condition is switched to detection mode M4 in a switching step of S14 (detection mode M4). After the detection condition of the detector is switched to detection mode M4, the surface state of the substrate W in the mold release step (S05) is detected. In the mold release step of S05, if the space between the substrate W and the mold M is widened while the mold M is in a tilted position, an imprinting defect, such as a fall of the pattern of the imprint material R formed on the substrate W, may occur. When the space between the substrate W and the mold M is widened, it is necessary to keep the substrate W and the mold M parallel to each other.

Therefore, in detection mode M4, the wavelength switching mechanism 37 uses a narrow band of wavelengths which provide a high contrast of interference fringes, and the image pickup element 35 selects a high frame rate for an image to be detected.

In the impressing step (S02) and the mold release step (S04), the wavelength switching mechanism 37 selects a narrow band of wavelengths for observation of interference fringes. The imprint material R on the substrate W is not patterned in the impressing step (S02), whereas the imprint material R on the substrate W is already patterned in the mold release step (S04). Therefore, there may be a difference in wavelength for observation of interference fringes between the impressing step (S02) and the mold release step (S04). In the mold release step (S04), even though the imprint material R is already patterned, a narrow band of wavelengths which provide a high contrast of interference fringes may be used. The narrow band of wavelengths may thus vary depending on whether there is a pattern on the substrate W.

FIGS. 14A to 14D illustrate a cross section of the mold M and the substrate W and an image picked up by the image pickup element when the mold release step of S04 is observed in detection mode M4. The image picked up by the image pickup element is output to an output unit, such as the display device 12, so that the state of separation between the imprint material R and the mold M can be observed. If the mold M is separated from the imprint material R while being tilted with respect to the substrate W, the center position of the interference fringes appears to be off the center position of the mold M (FIGS. 14A to 14D). When the wavelength switching mechanism 37 uses a narrow band of wavelengths, the center position of the interference fringes can be clearly identified and the position of the mold M can be observed. When the position of the mold M is controlled from the center position of interference fringes, the image pickup element 35 selects a high frame rate for image acquisition, so that the position of the mold M can be controlled with higher frequency.

After the mold release step of S05, the detection condition is switched to detection mode M5 in a switching step of S15 (detection mode M5). After the detection condition of the detector is switched to detection mode M5, a surface state of the substrate W at the end of the imprinting process is detected. It is desirable, as illustrated in FIG. 10F, that a pattern layer of the imprint material R be uniformly formed on the surface of the substrate W at the end of the imprinting process.

In detection mode M5, the polarization switching mechanism 38 performs setting such that a pitch direction of the pattern and a vibration direction of an electric field vector of illuminating light are parallel to each other. Also, the wavelength switching mechanism 37 uses a narrow of band wavelengths which intensify interference of reflected light from the substrate W and reflected light from the surface of the pattern layer of the imprint material R. Thus, it is possible to make an image detected by the image pickup element 35 clearer, and to detect whether the pattern layer is uniformly formed (i.e., detect an imprinting defect).

As described above, by switching the detection condition of the detector S in each step of the imprinting process, a state on the substrate in each step can be detected (or determined) with accuracy. Detecting a state on the substrate in accordance with the imprinting process is effective for prevention of imprinting defects. The steps of the imprinting process are performed in accordance with the driving sequence of the driving units of the imprinting apparatus described with reference to FIGS. 10A to 10F. Therefore, the detection condition of the detector S can be switched in accordance with the driving sequence of the driving units.

The flowchart of FIG. 11 illustrates an imprinting process performed on the substrate W having no pattern formed thereon. Even in the case of performing the imprinting process on the substrate W having a pattern formed thereon, a state on the substrate, which varies in each step, can be detected (or determined) with accuracy by setting a detection mode appropriate for each step of the imprinting process.

In the second embodiment, the detection condition is switched by switching the detection mode. Alternatively, without using the detection modes, the detector subunits DS of the detector S may be individually switched in accordance with each step of the imprinting process.

If the occurrence of an imprinting defect is found in the imprinting process, a step of removing the dust G on the substrate W may be carried out, or the location of the dust G may be stored. If the dust G on the substrate W cannot be removed, the imprinting process is not performed on the corresponding shot, or is performed such that the mold does not come into contact with (i.e., no pattern is formed in) a region of the substrate W onto which the dust G adheres.

Third Embodiment

Figure 15:
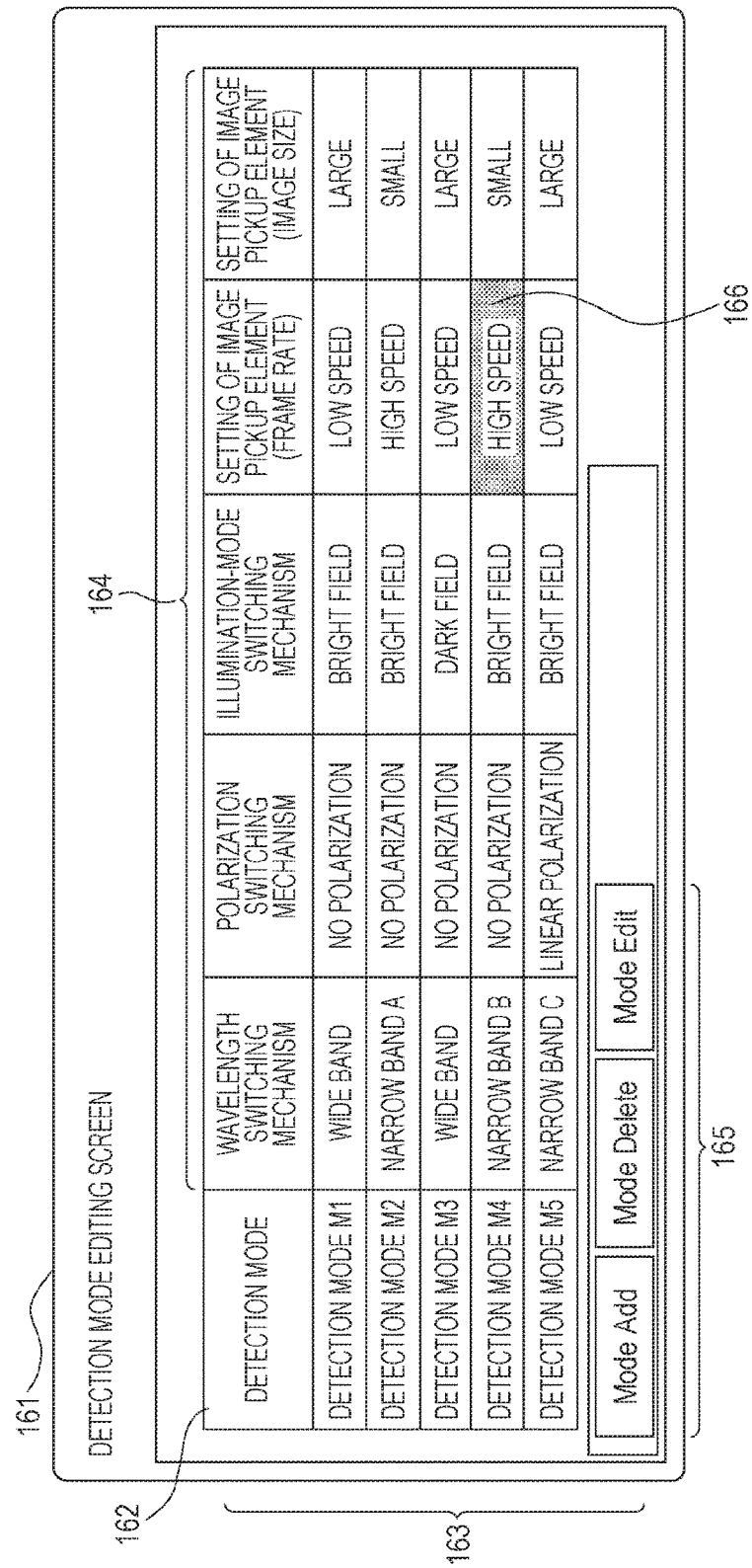
FIG. 15 is a diagram explaining a detection mode editing screen, in accordance with one or more aspect of the subject disclosure.
Figure 16:
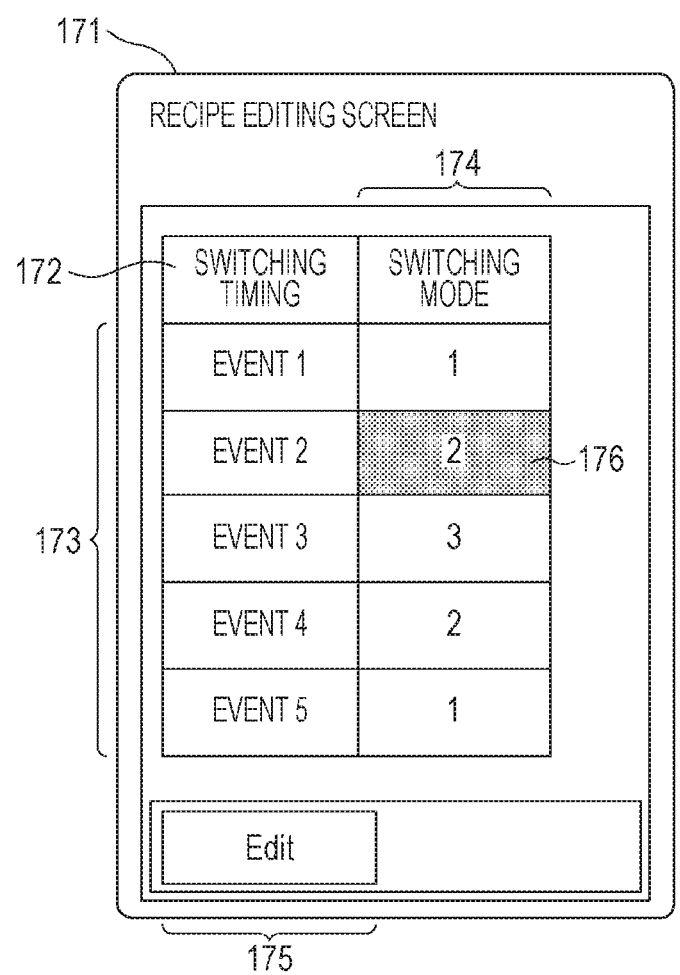
FIG. 16 is a diagram explaining a recipe editing screen, in accordance with one or more aspect of the subject disclosure.

An imprinting method of a third embodiment will be described on the basis of FIGS. 15 and 16. FIGS. 15 and 16 provide means for editing the detection modes shown in FIG. 12.

A detection mode editing screen 161 illustrated in FIG. 15 provides an editing means for editing the detection conditions of the detector subunits DS for each detection mode. A detection mode table 162 illustrated in FIG. 15 shows registered detection modes and settings of the detector subunits DS for each detection mode. Rows 163 of the detection mode table 162 show types of detection modes, and columns 164 of the detection mode table 162 show settings of the individual detector subunits DS forming the detection modes. The detection mode editing screen 161 is generated by the console unit CONS of FIG. 1 and displayed on the display device 12. The detection mode editing screen 161 is edited by selecting an object to be edited, such as an item 166, and operating an operation button group 165 with the input device 13 including the keyboard and mouse illustrated in FIG. 1.

A recipe editing screen 171 illustrated in FIG. 16 provides an editing means for editing the detection mode for each of the steps of the imprinting process. A detection mode setting table 172 for the steps shows a detection mode for each step. Rows 173 of the detection mode setting table 172 for the steps show types of the steps included in the imprinting process, and a column 174 of the detection mode setting table 172 shows a detection mode used in each step. The recipe editing screen 171 is generated by the console unit CONS of FIG. 1 and displayed on the display device 12. The recipe editing screen 171 is edited by selecting an object to be edited, such as an item 176, and operating an operation button group 175 with the input device 13 including the keyboard and mouse illustrated in FIG. 1.

Information edited on the detection mode editing screen 161 and the recipe editing screen 171 is stored in a memory device DB, such as a hard disk, included in the console unit CONS illustrated in FIG. 1. When the imprinting process is executed, the controller CNT switches the settings of the detector subunits DS included in the detector S in accordance with the information in the memory device DB.

Figure 17:
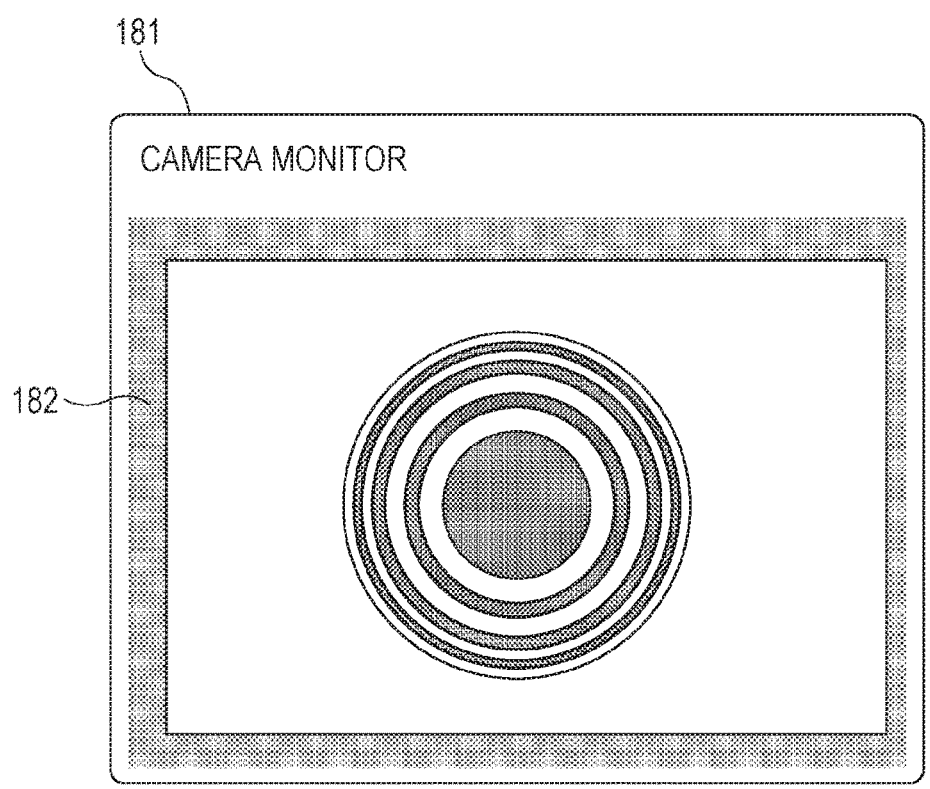
FIG. 17 is a diagram explaining a camera monitor, in accordance with one or more aspect of the subject disclosure.

FIG. 17 illustrates a camera monitor 181 displayed on the display device 12 of FIG. 1. An image detected by the image pickup element 35 is displayed in an image display area 182 of the camera monitor 181. The camera monitor 181 displays a detected image on a real-time basis. This allows observation of how the detection mode is switched in accordance with the imprinting process.

Others

In any of the embodiments described above, an apparatus using a photo-curing method, which is an imprinting method that cures the imprint material (photo-curable resin) by irradiating it with light (ultraviolet light), has been described as the imprinting apparatus IMP. Alternatively, the imprinting apparatus IMP of the present disclosure may be an apparatus using a thermal-curing method that cures the imprint material R with heat. In this case, a thermoplastic resin or thermosetting resin is used as the imprint material R. The imprinting apparatus IMP includes a heat source that supplies heat to the imprint material R. The present disclosure may be an imprinting method using a thermal cycling technique, as long as the detector S can detect, in the imprinting process, interference fringes in a contact region where the imprint material supplied onto the substrate and the mold are in contact and its surrounding region.

Device Manufacturing Method

A manufacturing method for manufacturing a device (semiconductor integrated circuit element, liquid crystal display element, etc.), which serves as an article, includes a step of forming a pattern on a substrate (wafer, glass plate, or film substrate) using the imprinting apparatus described above. The manufacturing method may further include a step of etching the substrate having the pattern formed thereon. For manufacture of other articles, such as a patterned medium (recording medium) and an optical element, the manufacturing method may include another process, instead of etching, for processing the substrate having a pattern formed thereon. The article manufacturing method of the present embodiment is advantageous over conventional methods in terms of at least one of performance, quality, productivity, and production cost of an article.

An imprinting apparatus can be provided in which, even when a state of an imprint material on a substrate changes, the state of the imprint material can be detected with accuracy.

While the present disclosure has been described with reference to exemplary embodiments, it is to be understood that the disclosure is not limited to the exemplary embodiments provided. The scope of the following claims is to be accorded the broadest interpretation so as to encompass all such modifications and equivalent structures and functions.

This application claims the benefit of International Patent Application No. PCT/JP2014/082972, filed Dec. 12, 2014, which is hereby incorporated by reference herein in its entirety.

The invention claimed is:

1. An imprinting apparatus for contacting an imprint material on a substrate with a mold, and forming a pattern of the imprint material on the substrate, the imprinting apparatus comprising:
   a detector comprising:
      a light source configured to irradiate the substrate with light,
      an image pickup device configured to optically detect reflected light from the substrate to detect a contact state of the imprint material on the substrate, and
      a switching mechanism to switch a detection condition while forming a pattern on the imprint material on the substrate by using the mold; based on the contact state of the imprint material on the substrate and the mold.

2. The imprinting apparatus according to claim 1, further comprising:
   a substrate holding unit configured to hold the substrate; and
   a mold holding unit configured to hold the mold,
   wherein at least one of the substrate holding unit and the mold holding unit is driven to bring the imprint material on the substrate and the mold into contact; and
   the detection condition is switched between those before and after the contact of the imprint material and the mold.

3. The imprinting apparatus according to claim 1, further comprising:
a substrate holding unit configured to hold the substrate; and
a mold holding unit configured to hold the mold,
wherein at least one of the substrate holding unit and the mold holding unit is driven to widen a space between the substrate and the mold; and
the detection condition is switched between those before and after separation of the mold from the imprint material.

4. The imprinting apparatus according to claim 1, wherein the detection condition is an irradiation condition of light for irradiating the substrate.

5. The imprinting apparatus according to claim 4, wherein the irradiation condition is a wavelength of the light for irradiating the substrate.

6. The imprinting apparatus according to claim 4, wherein the irradiation condition is an illumination mode for illuminating the substrate, the illumination mode being either bright-field illumination or dark-field illumination.

7. The imprinting apparatus according to claim 4, wherein the irradiation condition is a polarization state of the light for irradiating the substrate.

8. The imprinting apparatus according to claim 1, wherein the detection condition is a light receiving condition for receiving reflected light from the substrate.

9. The imprinting apparatus according to claim 8, wherein the light receiving condition switches between an aperture stop that transmits and blocks regular reflected light and diffracted light, respectively, of the reflected light from the substrate, and an aperture stop that transmits and blocks diffracted light and regular reflected light, respectively, of the reflected light from the substrate.

10. The imprinting apparatus according to claim 1, further comprising an output unit configured to output the state of the imprint material detected by the detector,
wherein the state of the imprint material output by the output unit includes a contact state between the imprint material and the mold.

11. The imprinting apparatus according to claim 1, further comprising a controller configured to control an operation of the imprinting apparatus,
wherein, from the state of the imprint material detected by the detector, the controller determines whether a contact state between the imprint material and the mold is good.

12. An imprinting apparatus that brings an imprint material on a substrate and a mold into contact, and forms a pattern of the imprint material on the substrate, the imprinting apparatus comprising:
a detector comprising:
a light source configured to irradiate the substrate with light,
an image pickup device configured to optically detect reflected light from the substrate to detect a state of surface of the substrate, and
a switching mechanism to switch a detection condition based on presence or absence of the imprint material on the substrate.

* * * * *